United States Patent
Krasnov

(10) Patent No.: US 9,935,211 B2
(45) Date of Patent: Apr. 3, 2018

(54) BACK CONTACT STRUCTURE FOR PHOTOVOLTAIC DEVICES SUCH AS COPPER-INDIUM-DISELENIDE SOLAR CELLS

(75) Inventor: Alexey Krasnov, Canton, MI (US)

(73) Assignee: Guardian Glass, LLC, Auburn Hills, MI (US)

( * ) Notice: Subject to any disclaimer, the term of this patent is extended or adjusted under 35 U.S.C. 154(b) by 620 days.

(21) Appl. No.: 13/455,282

(22) Filed: Apr. 25, 2012

(65) Prior Publication Data

US 2013/0284252 A1    Oct. 31, 2013

(51) Int. Cl.
*H01L 31/00* (2006.01)
*H01L 31/0224* (2006.01)
*H01L 31/032* (2006.01)
*H01L 31/0392* (2006.01)
*H01L 31/0749* (2012.01)

(52) U.S. Cl.
CPC .. *H01L 31/022425* (2013.01); *H01L 31/0322* (2013.01); *H01L 31/03923* (2013.01); *H01L 31/03928* (2013.01); *H01L 31/0749* (2013.01); *Y02E 10/541* (2013.01); *Y02P 70/521* (2015.11)

(58) Field of Classification Search
CPC .............. H01L 31/0264; H01L 31/03923
See application file for complete search history.

(56) References Cited

U.S. PATENT DOCUMENTS

| | | | |
|---|---|---|---|
| 4,335,266 A | 6/1982 | Mickelsen et al. | |
| 4,611,091 A | 9/1986 | Choudary et al. | |
| 4,915,745 A | 4/1990 | Pollock et al. | |
| 5,958,358 A | 9/1999 | Tenne et al. | |
| 6,077,722 A | 6/2000 | Jansen et al. | |
| 6,123,824 A | 9/2000 | Sano et al. | |
| 6,288,325 B1 | 9/2001 | Jansen et al. | |
| 6,784,361 B2 | 8/2004 | Carlson et al. | |
| 7,875,945 B2 | 1/2011 | Krasnov et al. | |
| 2004/0063320 A1 | 4/2004 | Hollars | |

(Continued)

FOREIGN PATENT DOCUMENTS

CN    101752454 A    6/2010
CN    102569442 A    7/2012
(Continued)

OTHER PUBLICATIONS

Wada et al., Characterization of the Cu(In,Ga)Se2/Mo Interface in CIGS Solar Cells, Thin Solid Films (2001), 118-122.*
Li et al., Density profiles in sputtered molybdenum thin films and their effects on sodium diffusion in Cu(InxGa1-x)Se2 photovoltaics, Conference Paper from 37th IEEE PV Specialists Conference (PVSC 37) of Jun. 19-24, 2011.*

(Continued)

*Primary Examiner* — Shannon Gardner
(74) *Attorney, Agent, or Firm* — Nixon & Vanderhye P.C.

(57) ABSTRACT

A back contact configuration for a CIGS-type photovoltaic device is provided. According to certain examples, the back contact configuration includes an optical matching layer and/or portion of or including $MoSe_2$ having a thickness substantially corresponding to maxima of absorption of reflected light in CIGS-type absorbers used in certain photovoltaic devices. Certain example methods for making the back contact configuration wherein a thickness of the $MoSe_2$ layer and/or portion can be controlled to be within thickness ranges that correspond to maxima of CIGS light absorption for reflected solar light are also provided.

15 Claims, 8 Drawing Sheets

(56) References Cited

U.S. PATENT DOCUMENTS

| | | |
|---|---|---|
| 2004/0144419 A1 | 7/2004 | Fix et al. |
| 2004/0261841 A1 | 12/2004 | Negami et al. |
| 2006/0180200 A1 | 8/2006 | Platzer Bjorkman et al. |
| 2007/0093006 A1 | 4/2007 | Basol |
| 2007/0193623 A1 | 8/2007 | Krasnov |
| 2009/0020157 A1 | 1/2009 | Krasnov et al. |
| 2009/0260678 A1 | 10/2009 | Di Stefano |
| 2009/0272422 A1 | 11/2009 | Li |
| 2010/0236629 A1 | 9/2010 | Chuang |
| 2010/0253204 A1 | 10/2010 | Boehler et al. |
| 2010/0297835 A1 | 11/2010 | Chuang et al. |
| 2010/0300512 A1 | 12/2010 | Auvray et al. |
| 2011/0097841 A1 | 4/2011 | Krasnov et al. |
| 2011/0168243 A1* | 7/2011 | Elowe et al. ............ 136/255 |
| 2012/0174977 A1 | 7/2012 | Choi |

FOREIGN PATENT DOCUMENTS

| | | |
|---|---|---|
| EP | 2 469 580 | 6/2012 |
| WO | WO 2006047207 A2 * | 5/2006 |
| WO | WO 2012/033033 | 3/2012 |

OTHER PUBLICATIONS

"Electrodeposition of Indium on Copper for CIS/CIGS Solar Cell Applications"; Huang et al., 2010 The Electrochemical Society (1pg).

"Cu—Mo Contacts to CaInSe$_2$ for Improved Adhesion in Photovoltaic Devices"; Yang et al., Journal of Applied Physics, vol. 75, No. 2, Jan. 15, 1994, pp. 1185-1189.

"Electrochemical Codeposition of Indium and Gallium for Chalcopyrite Solar Cells", Zank et al., Thin Solid Films 286 (1996), pp. 259-263.

"Chalcopyrite Thin Film Solar Cells by Electrodeposition", Lincot et al., Solar Energy 77 (2004), pp. 725-737.

U.S. Appl. No. 13/455,317, filed Apr. 25, 2012; Krasnov et al.

U.S. Appl. No. 13/455,232, filed Apr. 25, 2012; Krasnov et al.

U.S. Appl. No. 13/455,300, filed Apr. 25, 2012; Krasnov.

"Effect of a Thermal Oxydation Pre-Treatment on Mo to Control the Growth and Formation of MoSe$_2$ Layers for Use for CIGS Solar Cells"; Duchatclet et al., 25$^{th}$ European Photovoltaic Solar Energy Conference and Exhibition, Sep. 6-10, 2010, pp. 3379-3381.

"A Comprehensive Characterization of the Interfaces in Mo/Cis/CdS/ZnO Solar Cell Structures"; Schmid et al., Solar Energy Materials and Solar Cells 41/42, (1996); pp. 281-294.

* cited by examiner

US 9,935,211 B2

BACK CONTACT STRUCTURE FOR PHOTOVOLTAIC DEVICES SUCH AS COPPER-INDIUM-DISELENIDE SOLAR CELLS

CROSS-REFERENCE TO RELATED APPLICATIONS

This application is related to U.S. patent application Ser. Nos. 13/455,232, 13/455,300 and 13/455,317, filed concurrently herewith (now U.S. Pat. Nos. 9,246,025, 9,419,151, and 8,809,674, respectively), the entire disclosures of which are incorporated by reference herein in their entireties.

TECHNICAL FIELD

This disclosure relates generally to photovoltaic devices (e.g., solar cells), a back contact or rear electrode for use in photovoltaic devices such as solar cells, coated articles for use in photovoltaic devices such as solar cells and methods of making the same. The disclosure more particularly relates to a molybdenum-containing back electrode configuration that includes a layer of or including $MoSe_2$ disposed between a conductive layer comprising or consisting essentially of molybdenum (Mo) and an absorber (e.g., a CIGS based absorber film) of a solar cell. The back (or rear) electrode may also function as a rear reflector and/or optical coupler of reflected light in certain example instances. According to certain example embodiments disclosed herein, a thickness of the $MoSe_2$ layer is selected to provide improved absorption of reflected light by, for example, a CIGS absorber of a solar cell. The disclosure also relates to a method of making a solar cell or coated article for use in a solar cell that provides the ability to control the thickness of the resulting $MoSe_2$ layer, in connection with the surprising and unexpected fining that particular thickness ranges of the resulting $MoSe_2$ based layer improves performance of the photovoltaic device.

BACKGROUND AND SUMMARY OF EXAMPLE EMBODIMENTS

Many different types of photovoltaic devices are known in the art (e.g., see U.S. Patent Document Nos. 2004/0261841, 2006/0180200, U.S. Pat. Nos. 4,335,266, 4,611,091, 6,784,361, 6,288,325, 6,631,603, and 6,123,824, the disclosures of which are incorporated by reference herein in their entireties). Examples of known photovoltaic devices include CIGS (approximately $Cu(In, Ga)(Se,S)_2$ and/or $CuIn_{X-1}Ga_xSe_2$) solar cells. CIGS films are conductive semiconductor compounds that are often referred to as an absorber or light absorbing layer(s) or film. Generally speaking, CIGS type photovoltaic devices include, from the front or light incident side moving rearwardly, a front cover of material such as glass (front substrate), a front electrode comprising a transparent conductive layer(s) (e.g., a transparent conductive oxide such as zinc oxide), a light absorption semiconductor film (e.g., CIGS), a rear electrode/contact, and a rear substrate of a material such as, for example, glass (or metal foil for flexible applications). In some instances, an adhesive may be provided between the front cover glass and the front electrode. It is also the case in some instances that the device is provided with window layer(s) (e.g., of or including CdS, ZnS, or the like). Photovoltaic power is generated when light incident on the front side (or front cover glass) of the device passes through the front electrode and is absorbed by the light absorption semiconductor film (e.g., CIGS), as is known in the art. Certain designs may also utilize compositional grading of the semiconductor absorber, for example, with an increased Ga/(Ga+In) ratio toward the rear electrode or contact. Photovoltaic devices having a compositionally graded CIGS absorber may, for example, be made using a two- or three-step deposition process.

For example, with reference to FIG. 1, there is generally provided a schematic cross-sectional diagram illustrating various elements of a conventional CIGS-type photovoltaic device 10. The cell 10 is structurally supported on a rear glass substrate (or back glass) 12. A back contact comprising a metal layer, such as, for example, molybdenum (Mo) 14 is typically deposited on the glass substrate 12. The first active region of the device 10 comprises a semiconductor film 16 which is typically a p-type copper indium/gallium diselenide (CIGS). A thin "window" layer of n-type compound semiconductor 18, typically comprising cadmium sulfide (CdS) may then be formed on CIGS layer 16. A layer of conducting wide bandgap semiconductor material, typically formed of a substantially transparent conductive metal oxide, such as zinc oxide, is deposited on the CdS layer 18 and acts as a transparent front electrode 25 for the device 10. The device 10 may be completed by including a series of front face contacts (not shown) in the form of, for example, a metal grid on top of the transparent front electrode 25 to facilitate the extraction of generated electrons, and a front glass substrate 21. A large solar cell may also be divided into a number or smaller cells by means of scribes, such as, for example, laser or mechanical scribes or the like, traditionally referred to as P1, P2 and P3, which allow individual cells to be connected in series.

As noted above, a metal such as Mo may be used as the rear electrode (or back contact) 14 of a photovoltaic device, such as, for example, a CIGS solar cell 10, to extract positive charges generated in the CIGS semiconductor absorber 16 of the solar cell 10. In certain instances, the Mo rear electrode 14 may be sputter-deposited using, for example, direct-current magnetron sputtering, onto the back glass substrate 12 of the CIGS solar cell 10. There are certain advantages associated with using Mo as the material for the rear electrode (of course, it will be understood that Mo used in back contact configurations may include certain amounts of other elements and/or dopants of materials. Mo is inert to the CIGS absorber, and thus does not harmfully interfere with the CIGS and does not substantially alter the electrical, optical or mechanical properties of the CIGS. Using Mo to form the rear contact 14 may result in the formation of a thin molybdenum selenide ($MoSe_2$) layer (not shown in FIG. 1) at the interface between the Mo rear electrode 14 and the CIGS film 16. The formation of a $MoSe_2$ layer during the selenization process at the interface between the CIGS 16 and the Mo rear contact 14 provides an ohmic (e.g., non-rectifying) contact to the CIGS absorber which, in turn, facilitates hole extraction with reduced losses. Using sputter deposited Mo as the rear contact is also advantageous in that it is known to produce a surface morphology that is beneficial in CIGS growth for the formation of crystallites with large grain sizes that result in high carrier mobility, and thus higher efficiency photovoltaic devices.

It has been found that certain CIGS designs may benefit from reflecting light radiation (e.g., solar light) that initially passes through the CIGS absorber (16) without contributing to charge generation, back through the CIGS absorber, effectively recycling previously unused lost light by utilizing otherwise wasted light energy for charge generation.

For example, in arrangements that utilize compositional grading of the CIGS semiconductor absorber, for example, with increased Ga/(Ga+In) ratio toward the rear electrode or contact, the increased Ga concentration at the back of the photovoltaic device may lead to an increased bandgap of the absorber, which may result in lower absorption of incident light radiation (e.g., solar light), particularly in the near infrared region. This increased bandgap and corresponding lower absorption of light radiation reduces overall efficiency of the photovoltaic device because a portion of the light radiation (e.g., solar light) passes through the absorber without contributing to charge generation. The loss associated with incomplete light absorption typically increases with reduced thickness of the CIGS absorber.

According to certain example embodiments disclosed herein, it has been found that the $MoSe_2$ interface layer formed between the Mo rear contact and the CIGS absorber during a high-temperature selenization process used during CIGS formation plays an important role in optical coupling of the reflected light. Moreover, according to certain embodiments disclosed herein, it has been found that at certain thicknesses, $MoSe_2$ can provide improved optical coupling of the reflected light and significantly enhance the light absorbance of reflected light in the CIGS absorber.

According to example embodiments disclosed herein, it has been found that $MoSe_2$ thicknesses that substantially correspond to maxima ranges of the absorbance of reflected light have little or substantially no dependence on the extinction coefficient and/or thickness of the CIGS absorber. It has also been found that these newly identified maxima ranges do not correspond to thicknesses of $MoSe_2$ that are conventionally formed (unintentionally) at an interface of a Mo rear contact and CIGS absorber in prior art devices during selenization. Thus, it has been discovered that optimizing thickness of the $MoSe_2$ layer can be achieved substantially independently of CIGS thickness and extinction coefficient. According to certain example embodiments disclosed herein controlling the $MoSe_2$ thickness to desired range(s) provides increases in solar light absorption in the CIGS in the range of, for example, and without limitation, by at least about 5%, more preferably by at least about 10%.

In certain example embodiments disclosed herein, methods for making a photovoltaic device and/or a coated article for use in a photovoltaic device in which a thickness of the resulting $MoSe_2$ layer is controlled to desirable range(s) is also provided. It is noted that intermediate coated articles may be provided by a large area thin-film coating facility/manufacturer to photovoltaic device manufacturers and may include foundational (or seed) layers of different material composition than the finally desired $MoSe_2$ layer. These example foundational or seed layer(s) are subsequently used to form the $MoSe_2$ having the desired thickness during high temperature selenization process used to form the CIGS that may be performed by a downstream photovoltaic device manufacturer.

In certain example embodiments disclosed herein, a back contact for a photovoltaic device includes a rear substrate (e.g., soda-lime-silica based glass or metal foil in certain flexible applications); a rear contact comprising a first conductive layer comprising or consisting essentially of molybdenum; a second conductive layer comprising or consisting essentially of $MoSe_2$ having a desired thickness; a semiconductor absorber layer disposed above the $MoSe_2$ inclusive layer; a front transparent electrode formed above the semiconductor absorber layer; and a front substrate (e.g. front substrate comprising glass). According to certain example embodiments, the preferred thickness of the $MoSe_2$ inclusive layer may, for example, preferably be in range(s) corresponding to a maxima of the absorbance of reflected light in the CIGS absorber, such as, for example, and without limitation, in ranges including from about: 5-15 nm, 35-45 nm, 60-70 nm, and/or 90-100 nm, and more preferably at least one of about ("about" as used herein regarding these thicknesses means plus/minus 1 nm) 10, nm, 40 nm, 65 nm and/or 95 nm.

According to further example embodiments disclosed herein, a back contact structure for use in a photovoltaic device is provided, the back contact structure comprising: a rear substrate; and a back contact layer comprising a first Mo region having a first density and a second Mo region having a second density, said first density being more dense than said second density, said second Mo region being formed at an outer portion of the back contact layer above the first Mo region, said second Mo region forming a foundational seed region, wherein a thickness of said foundational seed region comprising Mo having the second density has a thickness in a range selected from the group consisting of: about 5-15 nm, about 35-45 nm, about 60-70 nm, and about 90-100 nm, and wherein the high density region of the back contact is located between the rear substrate and the foundational seed layer.

In order to achieve the example preferred thickness of the layer of or including $MoSe_2$ discussed above, further example embodiments directed to methods for making a back contact for use in photovoltaic devices are disclosed. According to a first example embodiment, a foundational (or seed) layer of or including $MoO_x$ having a thickness substantially corresponding to a desired thickness of $MoSe_2$ may be deposited, for example, (e.g., as a last step) after deposition of the Mo inclusive rear contact. During subsequent high-temperature selenization, such as, for example, a process used to form the CIGS absorber, selenium substantially replaces at least some oxygen in the foundational (or seed) $MoO_x$ layer, thus forming a $MoSe_2$ inclusive layer having a desired thickness substantially corresponding to the thickness of the foundational $MoO_x$ based seed layer, and thus provide improved device performance, e.g., at or near a maxima of the absorption characteristics of CIGS and $MoSe_2$.

In certain example embodiments, methods for making a back contact for use in a photovoltaic device are provided, comprising: providing a rear substrate; depositing a first conductive contact layer comprising Mo on (directly or indirectly) and/or over ("over" also covers both directly and indirectly on) said rear substrate; and forming (e.g., depositing) a foundational seed layer comprising or consisting essentially of $MoO_x$ above/over said first conductive contact layer comprising or consisting essentially of Mo, said foundational seed layer having a thickness selected from the group consisting essentially of: from about 5-15 nm, from about 35-45 nm, from about 60-70 nm, and from about 90-100 nm. According to certain example embodiments, the method may further include heat treatment in a selenium inclusive atmosphere to form a layer of or including $MoSe_2$ out of at least the foundational seed layer.

According to another example embodiment, an outermost (or final) portion of the Mo rear contact may deposited and/or formed in such a manner that it is more susceptible to selenization during the high-temperature selenization process used in forming the CIGS absorber. For example, a lower density Mo layer/portion of the rear contact is more susceptible to selenization during the high-temperature selenization process used to form the CIGS absorber than is a higher density Mo used to form a bulk of the rear contact.

According to an example embodiment, the deposition conditions for depositing an outermost portion of Mo based film (a "film" can include one or more layers), having a thickness substantially corresponding to a desired thickness of a future to-be-formed $MoSe_2$ inclusive layer, may be altered such that a desired thickness of Mo having a lower density is formed as a foundational (or seed) layer or portion above a higher density Mo that forms a bulk of the rear electrode. For example, and without limitation, the lower density Mo foundational (or seed) portion or layer may have a density that is preferably at least about 5% lower, and more preferably at least about 10% lower, and more preferably at least about 20% lower, than that of the underlying higher density bulk of the Mo rear contact. An example deposition condition that results in lower density Mo deposition may include sputter depositing Mo at a higher pressure and lower power than the underlying higher density bulk of the Mo rear contact. For example, and without limitation, power-to-pressure ratio of the sputtering process used to form the more dense Mo portion of the rear contact may preferably be in a range of about 1/3 to about 1/20, and more preferably about 1/10, while the power-to-pressure ratio of the sputtering process used to form the less dense Mo portion of the Mo rear contact may preferably be in a range of 1/21 to 1/30, and more preferably about 1/25. An example sputtering process according to certain example embodiments may be direct-current magnetron sputtering. The lower density Mo portion of the rear contact may optionally include oxygen or other material(s), and regardless of whether it includes oxygen or not it is more susceptible to selenization during the high-temperature selenization process used to form the CIGS absorber, and thus the thickness of the less dense outermost portion of the Mo rear contact may be used to control the thickness of the resulting $MoSe_2$ layer to the desired example range(s) discussed above.

According to certain further example embodiments, methods are provided for making a back contact for a photovoltaic device comprising: providing a rear substrate; depositing a back contact layer comprising a first Mo inclusive region having a first density and a second Mo inclusive region having a second density, said first density being greater than said second density, said second Mo inclusive region being formed at an outer portion of the back contact layer above the first Mo inclusive region, said second Mo inclusive region forming a foundational seed region, wherein a thickness of said foundational seed region comprising Mo having the second density has a thickness in a range selected from the group consisting of: from about 5-15 nm, from about 35-45 nm, from about 60-70 nm, and from about 90-100 nm. According to certain further example embodiments, this method may further include heat treatment in a selenium inclusive atmosphere to form a layer comprising or consisting essentially of $MoSe_2$ out of the foundational seed layer, which also has a thickness in a range selected from the group consisting of: from about 5-15 nm, from about 35-45 nm, from about 60-70 nm, and from about 90-100 nm.

These and other embodiments and/or advantages are described herein with respect to certain example embodiments and with reference to the following drawings in which like reference numerals refer to like elements, and wherein:

DETAILED DESCRIPTION OF EXAMPLE EMBODIMENTS

Figure 1:
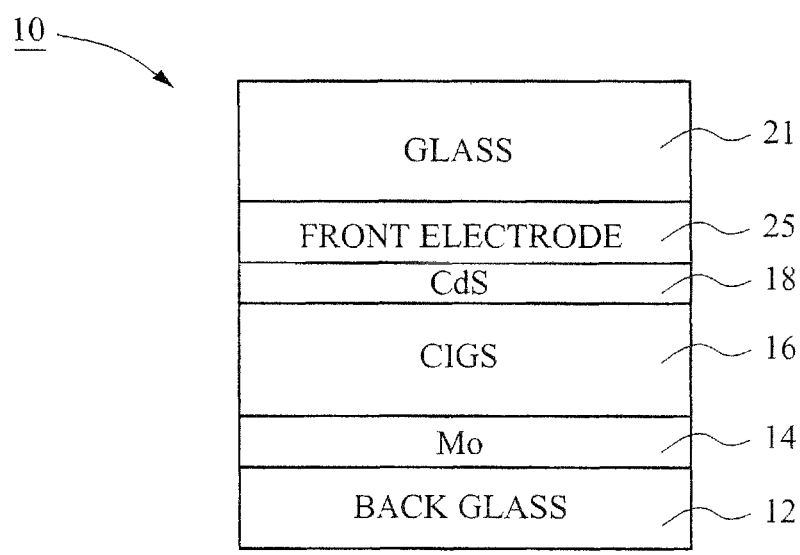
FIG. 1 is a cross sectional view of an example prior art CIGS photovoltaic device.

Referring now more particularly to the figures in which like reference numerals refer to like elements throughout the several views, detailed descriptions of example embodiments are disclosed herein.

Photovoltaic devices such as solar cells convert solar (or other light) radiation into usable electrical energy. The energy conversion typically occurs as a result of the photovoltaic effect. Light radiation (such as, for example, sunlight) impinging on a photovoltaic device and absorbed by an active region of semiconductor material (e.g., a semiconductor film including one or more semiconductor layers, such as, for example, CIGS), sometimes called an absorbing layer or film, generates electron-hole pairs in the active region. The electrons and holes may be separated by an electric field of a junction in the photovoltaic device. The separation of electrons and holes by the junction results in the generation of an electric current and voltage. In certain example embodiments, the electrons flow toward the region of the semiconductor material having n-type conductivity, and holes flow toward the region of the semiconductor having p-type conductivity. Current can flow through an external circuit connecting the n-type region to the p-type region (or vice versa) as impinging light energy continues to generate electron-hole pairs in the photovoltaic device.

Certain CIGS configurations may utilize compositional grading of the semiconductor absorber, for example, with an increased Ga/(Ga+In) ratio toward the rear electrode or contact. Photovoltaic devices having a compositionally graded CIGS absorber may, for example, be made using a two- or three-step deposition process. It has been found that certain GIGS designs may benefit from reflecting light radiation (e.g., solar light) that initially passes through the GIGS absorber without contributing to charge generation, back through the GIGS absorber, effectively recycling previously unused lost light by utilizing otherwise wasted light energy for charge generation. For example, and without limitation, in arrangements that utilize compositional grading of the GIGS semiconductor absorber, for example, with increased Ga/(Ga+In) ratio toward the rear electrode or contact, the increased Ga concentration at the back of the photovoltaic device may lead to an increased bandgap of the absorber, which may result in lower absorption of incident light radiation (e.g., solar light), particularly in the near infrared region. This increased bandgap and corresponding lower absorption of light radiation reduces overall efficiency of the photovoltaic device because a portion of the solar light passes through the absorber without contributing to charge generation. The loss associated with incomplete light absorption typically increases with reduced thickness of the GIGS absorber.

An example way of harnessing the light that passes through the GIGS absorber without contributing to charge generation, and thus improving the efficiency of photovoltaic devices, such as, for example, and without limitation, a GIGS solar cell, is to reflect light radiation (e.g., solar light) that initially passes through the GIGS absorber without contributing to charge generation, back through the GIGS absorber, effectively recycling previously unused lost light by utilizing otherwise wasted light energy for charge generation.

According to certain example embodiments disclosed herein, it has been found that the $MoSe_2$ interface layer formed between the Mo rear contact and the CIGS absorber during a high-temperature selenization process used during CIGS formation plays an important role in optical coupling of light reflected back to the CIGS absorber. Moreover, according to certain example embodiments disclosed herein, it has been found that at certain thicknesses, $MoSe_2$ can provide improved optical coupling of the reflected light and significantly enhance the light absorbance of reflected light in the CIGS absorber.

Figure 5:
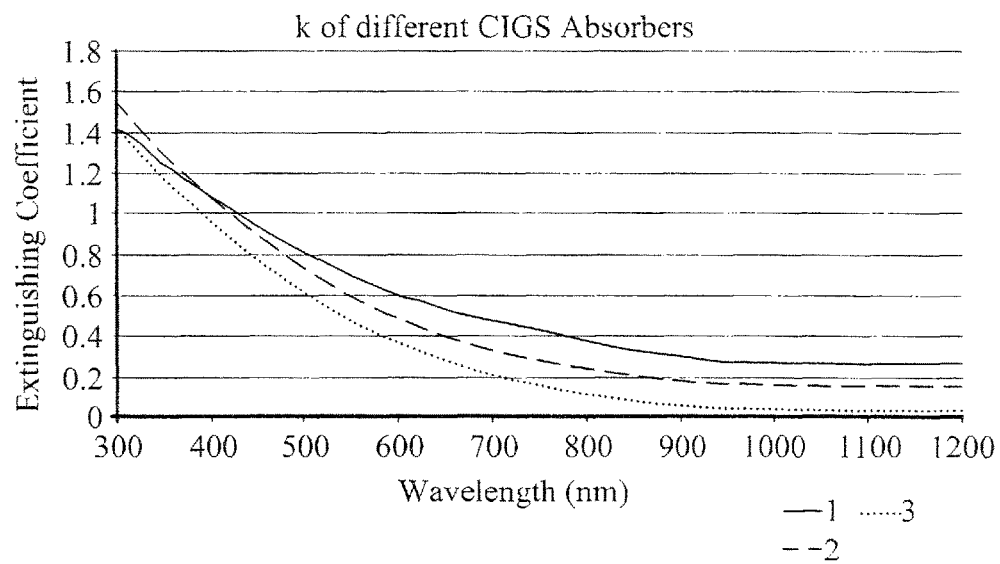
FIG. 5 is a graphical illustration extinguishing coefficients (k) of three different CIGS absorbers.
Figure 6:
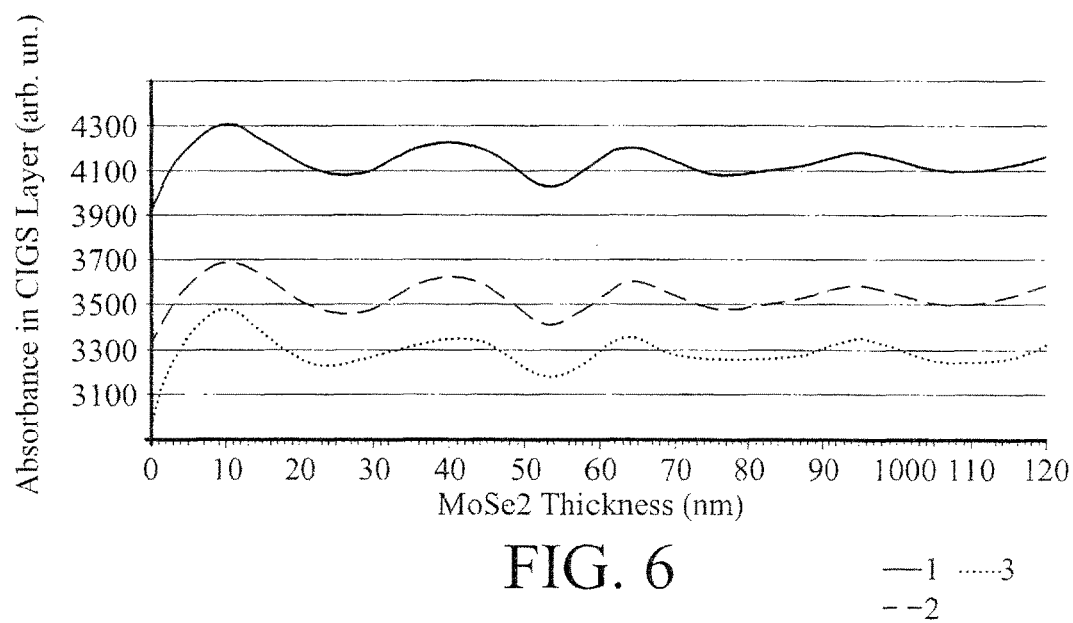
FIG. 6 is a graphical illustration showing the effect of $MoSe_2$ layer thickness on absorbance by various CIGS absorbers (shown in FIG. 5) of reflected solar light.
Figure 7:
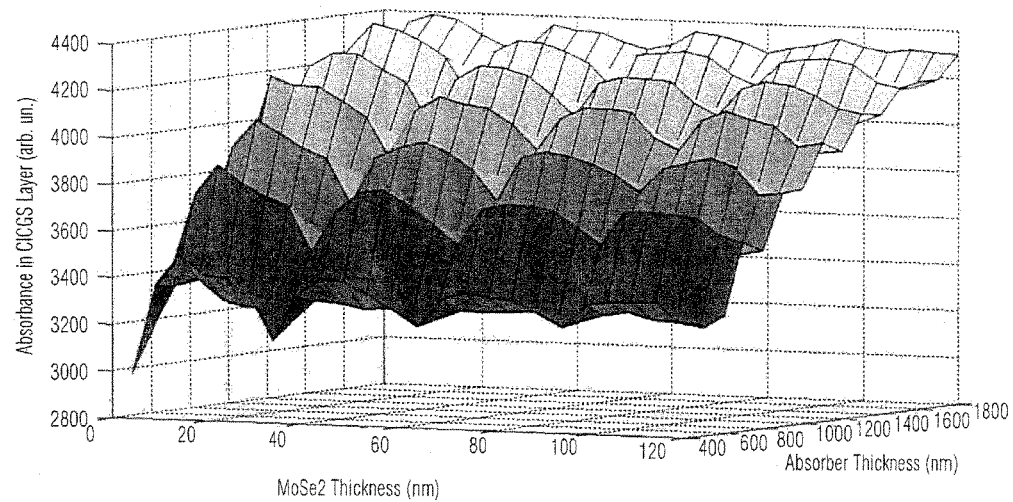
FIG. 7 is a graphical representation showing a relationship between CIGS optical absorbance, $MoSe_2$ thickness and CIGS thickness.
Figure 8:
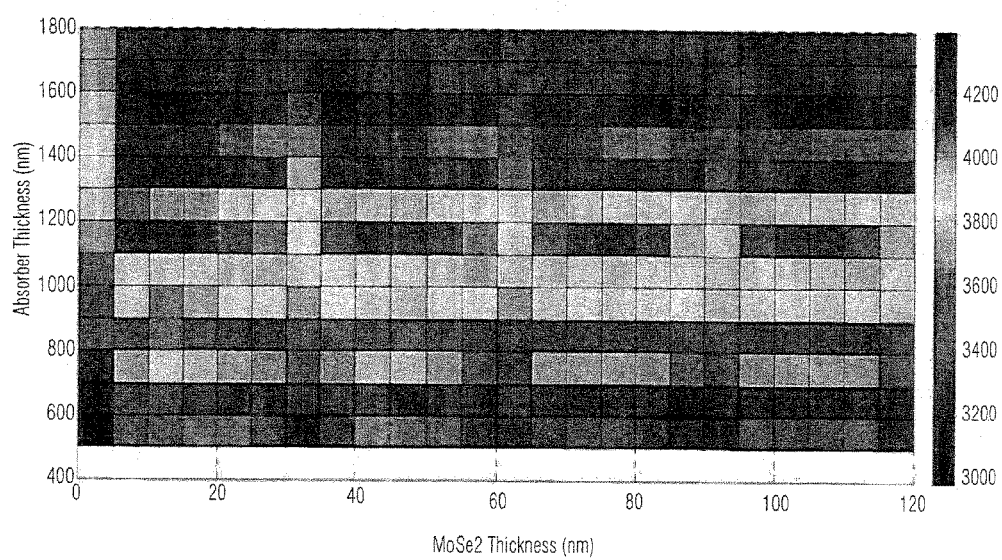
FIG. 8 is a graphical illustration showing the distribution of $MoSe_2$ layer thickness and CIGS absorber thickness with respect to absorption of light.

For example, with reference to FIG. 5, a graphical representation illustrating the extinguishing coefficient (k) of certain CMS absorber configurations is provided. These extinguishing coefficients were used to determine the effect of $MoSe_2$ layer thickness on light absorbance in the CIGS absorber layer on the second pass. Based on these extinguishing coefficients, light absorbance in three different CIGS absorber layers (shown in FIG. 6 as a solid line, a dashed line and a dotted line, each representing a different CIGS absorber layer) were determined for various thicknesses of $MoSe_2$. It was found that certain ranges of thickness of the $MoSe_2$ layer provided improved light absorbance in the CIGS absorber layer on the second pass (i.e., of the reflected light that was unused in the first pass), independently of the extinguishing coefficient (k) of the CIGS absorber. FIG. 6 illustrates the improved absorbance of the various CIGS absorber layer thicknesses as compared to various thicknesses of the $MoSe_2$ interface layer. The peaks of each of the lines corresponding to various CIGS absorber layers considered shows that absorbance is related to thickness of the $MoSe_2$ layer, and that the relationship, unexpectedly, is not linear. Surprisingly, the effect of $MoSe_2$ thickness increases and decreases periodically over the range of thicknesses observed. The non-linear relationship between $MoSe_2$ thickness and CIGS absorbance is further shown in FIGS. 7 and 8, which graphically show that the periodic non-linear relationship of $MoSe_2$ thickness to CIGS absorbance is independent of absorber thickness, and that maxima and minima of CIGS absorbance appear at substantially the same thickness ranges of $MoSe_2$, regardless of CIGS type or thickness.

Thus, according to example embodiments disclosed herein, it has been found that $MoSe_2$ thicknesses that substantially correspond to maxima ranges of the absorbance of reflected light have little or no dependence on the extinction coefficient and/or thickness of the CIGS absorber. Thus, it has been discovered that optimizing thickness of the $MoSe_2$ layer 15 can be achieved substantially independently of CIGS thickness and its extinction coefficient. According to certain example embodiments disclosed herein controlling the $MoSe_2$ 15 thickness to desired ranges substantially corresponding to maxima ranges of reflected light absorption of CIGS provides increases in solar light absorption in the CIGS in the range of, for example, and without limitation, about 10% or more.

It is also noted that the thickness of conventional unintentionally formed $MoSe_2$, which is formed in an uncontrolled manner as a result of the high-temperature selenization process used to form CIGS absorbers over Mo rear contacts in prior devices and methods, is in a range of about 20-30 nm thick. It is further noted that the range of about 20-30 nm thickness of unintentionally formed $MoSe_2$ does not substantially correspond to any maxima ranges of light absorbance of CIGS absorbers for various $MoSe_2$ thickness ranges illustrated in FIGS. 5-8. Instead, thicknesses of $MoSe_2$ in ranges of 20-30 nm correspond more closely with absorption minima, as can be seen in FIGS. 5-8. However, it was found that certain preferred ranges of $MoSe_2$ thickness (independent of CIGS extinguishing coefficient and/or CIGS thickness) that provide improved absorbance of reflected light by CIGS absorbers are, for example, and without limitation, in a range of about: 5-15 nm, 35-45 nm, 60-70 nm, or 90-100 nm, and more preferably at least one of about (e.g, ±1 nm) 10, nm, 40 nm, 65 nm or 95 nm thick.

Having discovered these preferred ranges of thickness of the $MoSe_2$ inclusive layer 15, the inventors then developed methods for controlling thickness of a $MoSe_2$ layer formed during the high-temperature selenization process such that the resulting thickness of the realized $MoSe_2$ layer is in the preferred range to improve absorbance of reflected (and previously unused or wasted light) by the CIGS absorber. As noted above, without providing a method for controlling thickness of a the $MoSe_2$ layer, a thickness of about 20-30 nm typically results, and that this range of $MoSe_2$ thickness does not provide the desired improved absorbance of reflected light by the CIGS absorber.

Figure 2:
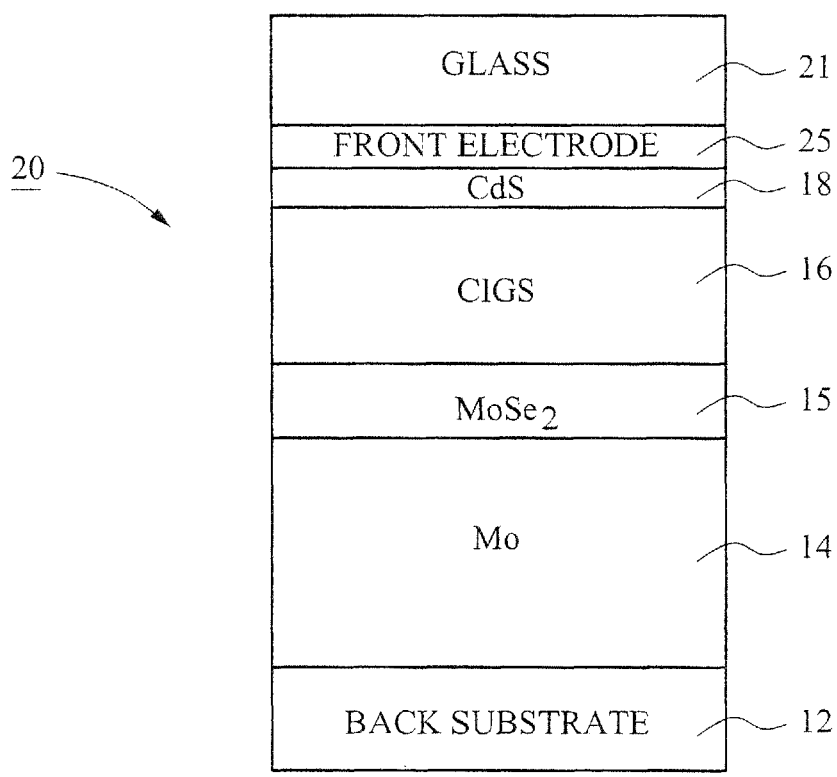
FIG. 2 is a cross sectional view of an example photovoltaic device according to certain example embodiments disclosed herein.

With reference now to FIG. 2, a cross section of an example CIGS photovoltaic device including a controlled thickness $MoSe_2$ layer 15 according to an example, non-limiting, embodiment is illustrated. The photovoltaic device (e.g., solar cell) 20 is structurally supported on a back substrate 12, which may, for example, comprise soda-lime-silica based glass (or metallic foil for flexible applications). A conductive and reflective rear or back contact 14 substantially comprising or consisting essentially of Mo is disposed on (directly or indirectly) or above the back substrate 12. According to certain example embodiments, the Mo inclusive or Mo-based back contact 14 may preferably be deposited using direct-current magnetron sputtering in an argon (e.g., inert) inclusive atmosphere. The thickness of Mo 14 according to an example embodiment is in a range of about 200-900 nm. It will be understood that the Mo back contact 14 may include certain trace or minor amounts of other elements or dopants of materials that do not substantially affect the performance, mechanical or electrical characteristics of Mo in the back contact 14. A controlled thickness interfacial layer of $MoSe_2$ 15 is formed directly on the Mo back contact 14. The thickness of the layer of or including MoSe2 according to certain example embodiments has been found to be, for example, and without limitation, to be preferably in a range of about: 5-15 nm, 35-45 nm, 60-70 nm, or 90-100 nm, and more preferably at least one of about (e.g, ±1 nm) 10, nm, 40 nm, 65 nm or 95 nm thick. A CIGS absorber 16 is provided on or above the interfacial $MoSe_2$ layer 15. The photovoltaic device 20, may further be provided with a thin "window" layer of or including n-type compound semiconductor 18, typically comprising cadmium sulfide (CdS), on CIGS inclusive layer 16. A transparent conductive layer of conducting wide bandgap semiconductor material 25, typically formed of a substantially transparent conductive metal oxide, such as tin oxide or zinc oxide, is deposited on the CdS layer 18 and acts as a transparent front electrode 25 for the photovoltaic device 20. The device 20 may be completed by including a series of front face contacts (not shown) in the form of, for example, a metal grid on top of the transparent front electrode 25 to facilitate the extraction of generated electrons, and a front glass substrate 21 (e.g., front cover glass). A large solar cell may also be divided into a number or smaller cells by means of scribes, such as, for example, laser or mechanical scribes or the like, traditionally referred to as P1, P2 and P3, which allow individual cells to be connected in series.

Optionally, in any embodiment herein (e.g., FIGS. 2-4, 9-10), a dielectric layer(s) (not shown) may be provided directly or indirectly on the rear substrate 12 so as to be located between at least the rear substrate 12 and the rear contact (14, 15). The dielectric layer may be of or include silicon nitride and/or silicon oxynitride in certain example embodiments of this invention.

Figure 3A:
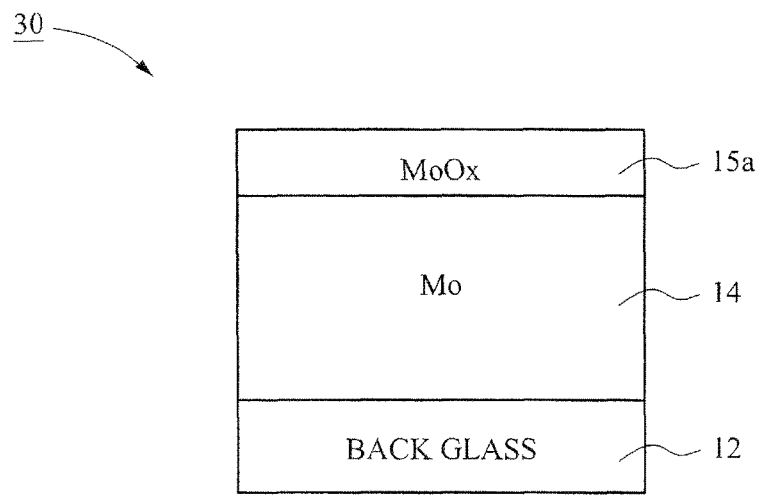
FIG. 3A is a cross sectional view of an example coated article for use in a photovoltaic device, such as, for example, a solar cell according to certain example embodiments disclosed herein in which MoOx may be used as an intermediate foundational or seed layer.

According to certain example embodiments, one example way of controlling thickness of a $MoSe_2$ interfacial layer 15 is to provide an intermediate foundational seed layer 15a comprising MoOx (see, e.g., FIG. 3A). It will be understood that the foundational MoOx seed layer 15a may be stoichiometric, or substoichiometric, in example embodiments. The MoOx seed layer 15a may have a smaller density than Mo layer 14 in certain example embodiments. The foundational seed layer 15a of or including MoOx is less conductive than the first conductive back contact layer 14 of or including Mo. And the foundational seed layer 15a of or including MoOx contains more oxygen than the substantially metallic and/or metallic first conductive back contact layer 14 of or including Mo, with the layer 14 containing no or little oxygen in different example embodiments. In order to achieve the example preferred thickness of $MoSe_2$ discussed above, according to an example embodiment, a foundational (or seed) layer of MoOx 15a having a thickness substantially corresponding to or based on a desired thickness of $MoSe_2$ 15 may be deposited, for example (e.g., as a last step), after deposition of the conductive Mo rear contact layer 14. During subsequent high-temperature selenization, such as, for example, a process used to form the CIGS absorber 16, selenium substantially replaces oxygen in the foundational (or seed) MoOx layer 15a, thus forming a $MoSe_2$ layer 15 having a desired thickness substantially corresponding to the thickness of the foundational MoOx seed layer 15a, thus providing improved performance for the photovoltaic device, e.g., at or substantially near a maxima of the absorption characteristics of CIGS and $MoSe_2$.

In this respect, with reference to FIG. 3A, a foundational intermediate coated article 30 for use in a photovoltaic device is illustrated in cross section. In this example, the back substrate 12 (preferably comprising soda-lime-silica based glass or metal foil in certain flexible applications) supports a conductive and reflective rear contact layer 14 comprising or consisting essentially of Mo. The thickness of Mo 14 according to an example embodiment is in a range of from about 200-900 nm. The thickness of the Mo rear contact layer 14 may, for example, further preferably be in a range of about 300-600 nm, and may further preferably be, for example, about 400 nm. It will be understood that the Mo back contact layer 14 may include certain trace or minor amounts of other elements or dopants of materials that do not substantially affect the performance, mechanical or electrical characteristics of Mo in the back contact 14. A foundational seed layer of MoOx 15a is then formed (e.g., deposited) directly on or above the Mo rear contact layer 14. The thickness of the MoOx seed layer 15a is determined based on the desired thickness of a resulting $MoSe_2$ layer 15 to be formed during subsequent high-temperature selenization performed during CIGS formation. As noted above, according to certain example embodiments, desired thicknesses of $MoSe_2$ 15 that provide advantages noted above are in a range of about: 5-15 nm, 35-45 nm, 60-70 nm, or 90-100 nm, and more preferably at least one of about (e.g, ±1 nm) 10, nm, 40 nm, 65 nm or 95 nm thick. Thus, a thickness of the foundational MoOx seed layer 15a substantially corresponds to and/or is based on a desired thickness of the resulting $MoSe_2$ layer 15. According to certain example embodiments, MoOx 15a is preferably deposited by sputtering Mo in an argon and oxygen ($Ar+O_2$) atmosphere. In addition, example preferred ratios of Ar to $O_2$ are in the range of (20-150)/1, and preferably in a range of (30-100)/1, and more preferably, for example, about 70/1.

Figure 3B:
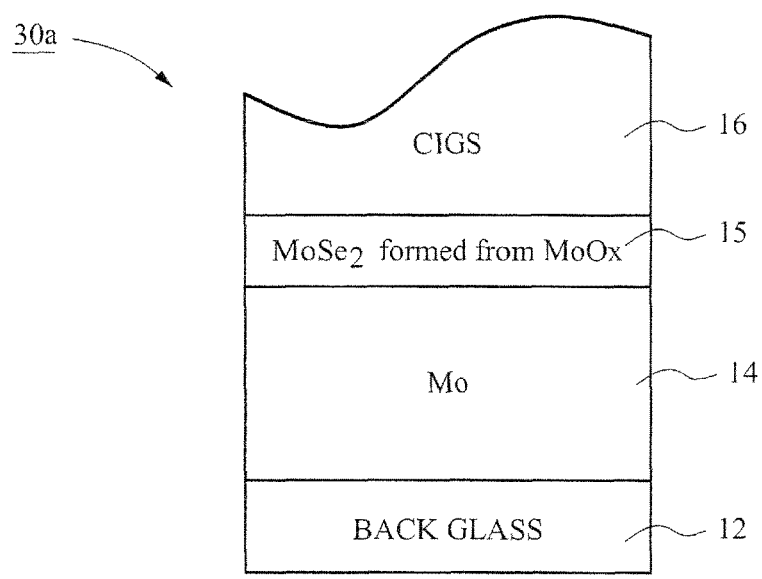
FIG. 3B is a cross sectional view of a portion of an example photovoltaic device, such as, for example, a solar cell, according to an example embodiment in which MoOx may be used as an intermediate foundational or seed layer.

FIG. 3B is a cross section of a portion of a resulting photovoltaic device 30a illustrating an interfacial layer of $MoSe_2$ 15 formed by high-temperature selenization used during the CIGS 16 formation process. As noted above, the thickness of the resulting MoSe2 layer 15 is preferably, for example, in a range of about: 5-15 nm, 35-45 nm, 60-70 nm, or 90-100 nm, and more preferably at least one of about (e.g, ±1 nm) 10, nm, 40 nm, 65 nm or 95 nm thick, and is based on a thickness of the seed layer MoOx seed layer 15a.

Figure 4A:
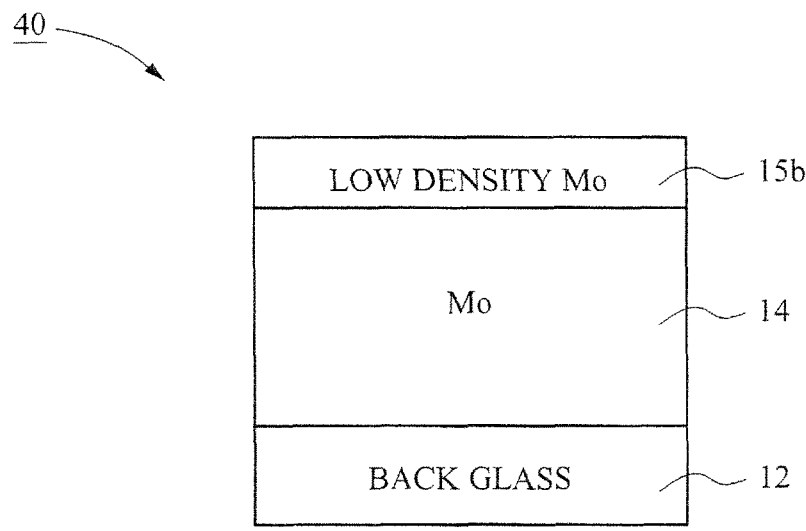
FIG. 4A is a cross sectional view of an example coated article for use in a photovoltaic device, such as, for example, a solar cell according to certain example embodiments disclosed herein in which a low density Mo portion of a Mo rear contact may be used as an intermediate foundational or seed layer.

Referring now to FIG. 4A, another example embodiment of an intermediate foundational seed layer 15b is illustrated. As with FIG. 3A, a back substrate 12 (preferably comprising soda-lime-silica based glass or metal foil in certain flexible applications) supports a conductive and reflective rear contact layer 14 of or including Mo. The thickness of Mo 14 according to an example embodiment is in a range of about 200-900 nm. As noted above, the thickness of the Mo rear contact layer 14 may, for example, further preferably be in a range of about 300-600 nm, and may further preferably be, for example, about 400 nm. It will be understood that the Mo back contact layer 14 may include certain trace or minor amounts of other elements or dopants of materials that do not substantially affect the performance, mechanical or electrical characteristics of Mo in the back contact 14. A foundational seed layer of or including lower density Mo 15b is formed during, for example, a late step in the sputter deposition of the Mo based rear contact, resulting in a higher density Mo portion 14 and a lower density Mo portion 15b disposed above the higher density Mo portion 14. The lower density seed layer 15b is less electrically conductive than the first conductive back contact layer 14 of or including Mo. As discussed above, lower density Mo 15b is more susceptible to selenization during the high-temperature selenization process used to form the CIGS absorber 16. Thus, by controlling the thickness of the low density Mo portion 15b, the thickness of the resulting $MoSe_2$ layer 15 to be subsequently formed during the high-temperature selenization process can be controlled.

According to certain example embodiments, an outermost (or final) portion 15b of the Mo inclusive rear contact 14 may deposited under conditions that may be altered such that a desired thickness of Mo having a lower density is formed as a foundational (or seed) layer or portion 15b above a higher density Mo that forms a bulk of the rear electrode 14. For example, and without limitation, the lower density Mo foundational (or seed) portion or layer 15b may have a density that is preferably at least about 5% or 10% lower (more preferably at least about 20% lower) than that of the underlying bulk of the Mo rear contact 14. An example deposition condition that results in lower density Mo 15b deposition may include sputter depositing Mo at a higher pressure and/or lower power than the underlying bulk of the Mo rear contact 14. For example, and without limitation, power-to-pressure ratio of the sputtering process used to form the more dense Mo portion 14 of the rear contact may preferably be in a range of from about 1/3 to about 1/20, and more preferably about 1/10, while the power-to-pressure ratio of the sputtering process used to form the less dense Mo inclusive portion 15b of the Mo rear contact may preferably be in a range of 1/21 to 1/30, and more preferably about 1/25. An example sputtering process according to certain example embodiments may be direct-current magnetron sputtering. The lower density portion 15b may optionally be oxided in certain instances. The lower density Mo portion 15b is more susceptible to selenization during the high-temperature selenization process used to form the CIGS absorber 16, and thus the thickness of the less dense outermost portion 15b of the rear contact structure may be used to control the thickness of the resulting $MoSe_2$ layer 15 to the desired example ranges discussed above.

Figure 4B:
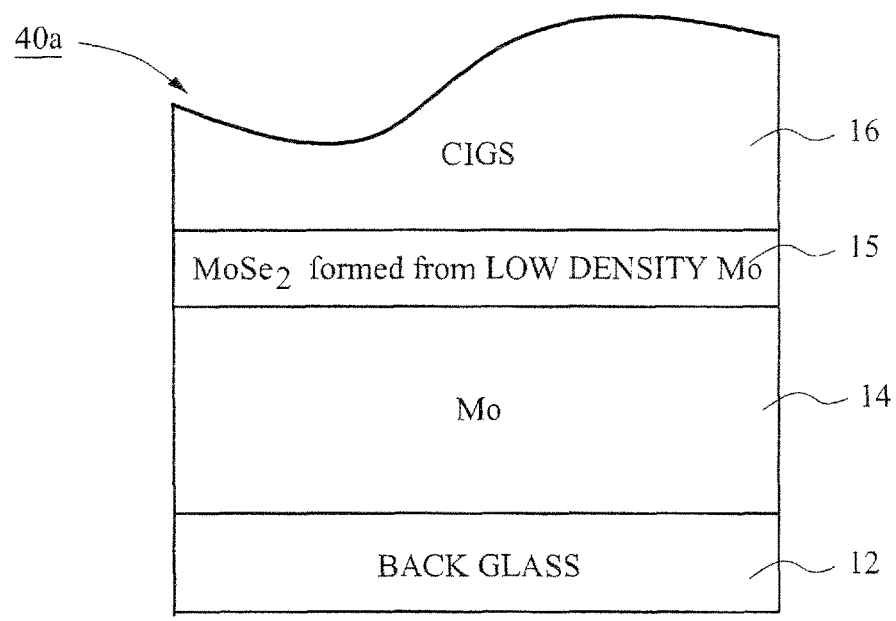
FIG. 4B is a cross sectional view of a portion of an example photovoltaic device, such as, for example, a solar cell, according to an example embodiment in which a low density Mo portion of a Mo rear contact may be used as an intermediate foundational or seed layer.

After formation of the FIG. 4A structure, FIG. 4B is a cross section of a portion of a resulting photovoltaic device 40a illustrating an interfacial layer of or including $MoSe_2$ 15 formed during high-temperature selenization used during the CIGS 16 formation process. As noted above, the thickness of the resulting MoSe2 layer 15 is preferably, for example, in a range of about: 5-15 nm, 35-45 nm, 60-70 nm, or 90-100 nm, and more preferably at least one of about (e.g, ±1 nm) 10, nm, 40 nm, 65 nm or 95 nm thick, and is based on at least a thickness of the foundational seed layer 15b.

Figure 9:
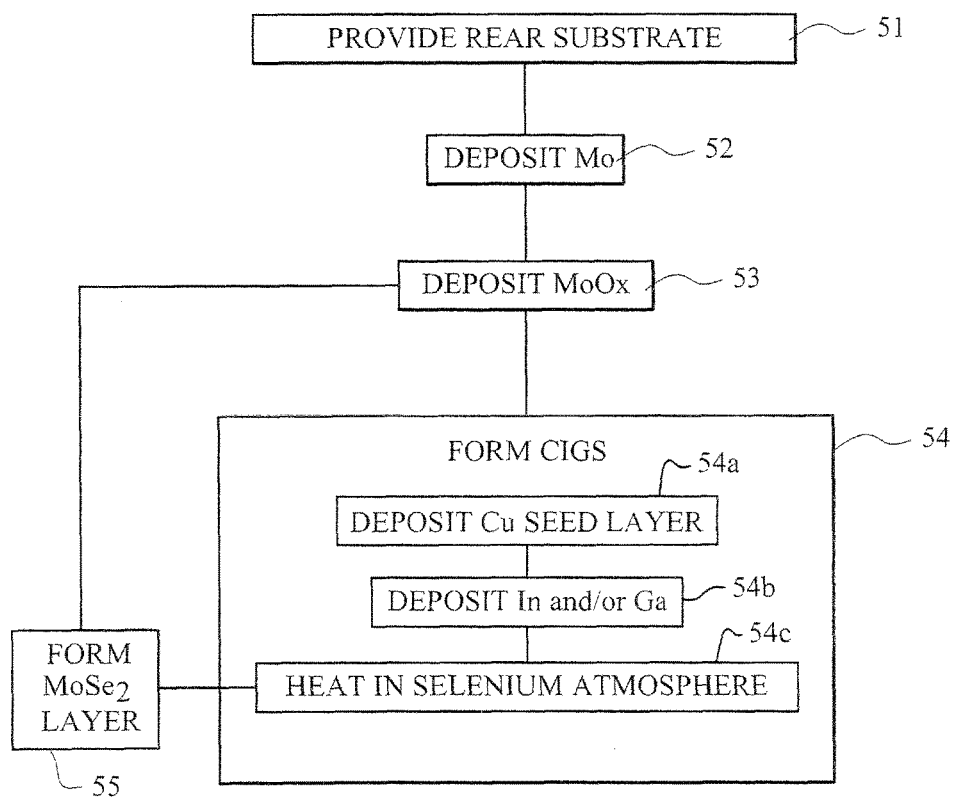
FIG. 9 is a flowchart illustrating a method of making a coated article for use in a photovoltaic device, such as, for example, a solar cell, according to certain example embodiments disclosed herein in which MoOx may be used as an intermediate foundational or seed layer.

With reference now to FIG. 9, an example process for making a photovoltaic device according to certain example embodiments is illustrated. As discussed above with reference to FIGS. 3A and 3B, a method of making a coated article in which MoOx may be used as a foundational or seed layer 15a for use in a photovoltaic device is discussed. According to this example, a rear substrate 12 (preferably comprising soda-lime-silica based glass or metal foil in certain flexible applications) is provided. A rear contact comprising Mo 14 is then deposited over the rear substrate 12 in step S2. In a preferred example, the Mo rear contact 12 may be deposited S2 using direct-current magnetron sputtering in an atmosphere of argon. According to certain example embodiments, a thickness of the Mo rear contact 14 is in a range of about 200-900 nm, and more preferably in a range of about 300-600 nm, and for example, more preferably about 400 nm. As noted above, it will be understood that the Mo back contact 14 may include certain trace or minor amounts of other elements or dopants of materials that do not substantially affect the performance, mechanical or electrical characteristics of Mo in the back contact 14. A foundational seed layer of MoOx 15a is then deposited on or above the Mo rear contact 14 (S3). The thickness of the MoOx seed layer 15a is determined based on the desired thickness of a resulting $MoSe_2$ layer 15 formed during subsequent high-temperature selenization performed during CIGS formation discussed below. As noted above, according to certain example embodiments, desired thicknesses of $MoSe_2$ that provide advantages noted above are in a range of about: 5-15 nm, 35-45 nm, 60-70 nm, or 90-100 nm, and more preferably at least one of about (e.g, ±1 nm) 10, nm, 40 nm, 65 nm or 95 nm thick. Thus, it will be understood that, for example, a preferred thickness of the foundational MoOx seed layer 15a corresponds to a desired thickness of the resulting $MoSe_2$ layer 15. According to certain example embodiments, MoOx is preferably deposited by sputtering in an argon and oxygen $(Ar+O_2)$ atmosphere. In addition, example preferred ratios of Ar to $O_2$ are in the range of (20-150)/1, and preferably in a range of (30-100)/1, and more preferably, for example, about 70/1. After deposition of the MoOx seed layer 15a (S3), a CIGS absorber 16 is formed over the MoOx seed layer 15a (S4). As described above, according to certain embodiments, the CIGS absorber 16 preferably comprises a semiconductor layer 16 comprising copper indium diselenide or p-type CIGS layer (approximately $CuIn_{x-1}Ga_xSe_2$). The CIGS layer 16 may be formed S4, for example, by depositing a "seed" layer comprising Cu by, for example, co-evaporation, sputtering, electroplating or any other suitable deposition technique S4a. Other components of the CIGS absorbing layer 16, e.g., indium and/or gallium, are deposited on the Cu layer S4b and react with the Cu at high temperature, such as, for example, about 550° C., in a selenium atmosphere S4c, thereby forming the CIGS semiconductor absorber 16 in step S4. As noted above, during the high-temperature selenization process S4c used to form the CIGS, the oxygen of the MoOx layer 15a is substituted or replaced by selenium to form a $MoSe_2$ layer 15 (S5) having a thickness based on the thickness of the foundational MoOx seed layer 15a. Other layers and substrates may be provided in known manners to provide a completed photovoltaic device.

Figure 10:
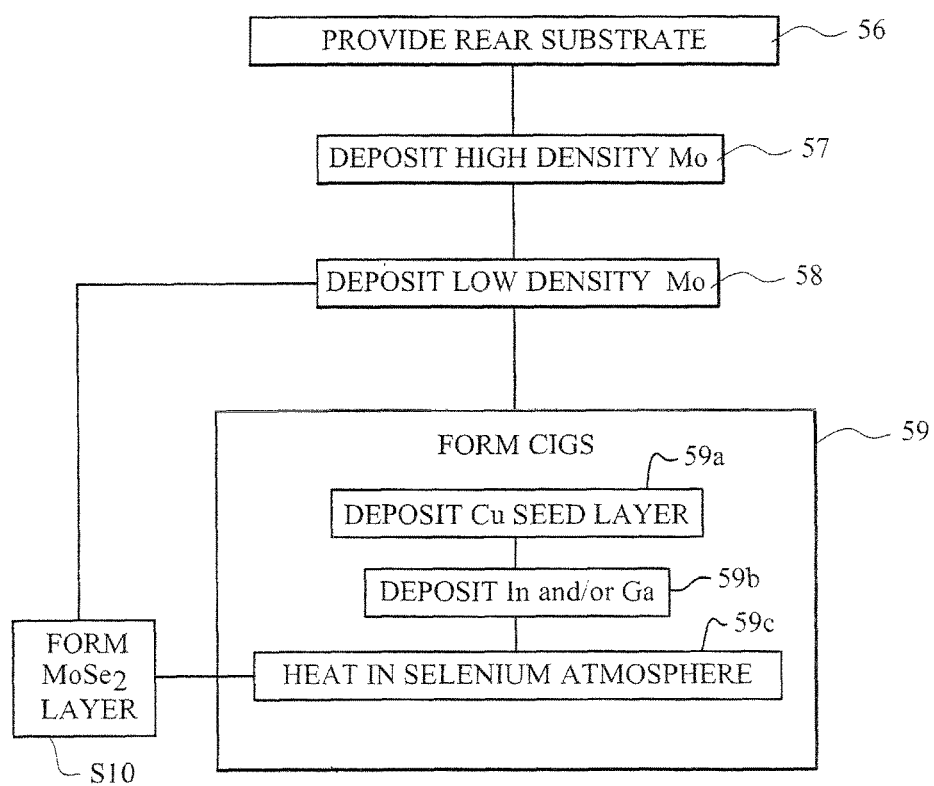
FIG. 10 is another flowchart illustrating a method of making a coated article for use in a photovoltaic device, such as, for example, a solar cell, according to certain example embodiments disclosed herein in which a low density Mo portion of a Mo rear contact may be used as an intermediate foundational or seed layer.

Turning now to FIG. 10 another alternative example method for making a photovoltaic device according to certain example embodiments is illustrated. As discussed above with reference to FIGS. 4A and 4B, a method of making a coated article in which lower density Mo may be used as a foundational or seed layer 15b for use in a photovoltaic device is discussed. According to this example, a rear substrate 12 (preferably comprising soda-lime-silica based glass or metal foil in certain flexible applications) is provided S6. A rear contact comprising Mo 14 is then deposited over the rear substrate 12 in step S7. In a preferred, non-limiting example, a thickness of the Mo rear contact 14 is in a range of about 200-900 nm, and more preferably in a range of about 300-600 nm, and for example, more preferably, for example, about 400 nm. It will be understood that the Mo back contact 14 may include certain trace or minor amounts of other elements or dopants of materials that do not substantially affect the performance, mechanical or electrical characteristics of Mo in the back contact 14. According to certain example embodiments, the Mo rear contact 14 is deposited using direct-current magnetron sputtering in an argon atmosphere. A foundational seed layer of lower density Mo 15b is provided as, for example, an outermost portion of the Mo rear contact 14 (e.g., as a final step) S8 in the sputter deposition of the Mo rear contact 14, resulting in a higher density Mo portion 14 and a lower density Mo portion 15b disposed above the higher density Mo portion 14. As discussed above, lower density Mo is more susceptible to selenization during the high-temperature selenization process S9c used to form the CIGS absorber 16. Thus, by controlling the thickness of the low density Mo portion 15b, the thickness of the resulting MoSe$_2$ layer 15 subsequently formed during the high-temperature selenization process can be similarly controlled. As noted above, according to certain example embodiments, desired thicknesses of MoSe$_2$ that provide advantages noted above are in a range of about: 5-15 nm, 35-45 nm, 60-70 nm, or 90-100 nm, and more preferably at least one of about (e.g., ±1 nm) 10, nm, 40 nm, 65 nm or 95 nm thick. Thus, it will be understood that, for example, a preferred thickness of the foundational low density Mo seed layer 15b is based on or corresponds to a desired thickness of the resulting MoSe$_2$ layer 15. According to certain example embodiments, an outermost (e.g., final) portion 15b of the Mo rear contact 14 may deposited S8 under conditions that may be altered with respect to the deposition of the bulk of the Mo rear contact 14 (S7) such that a desired thickness of Mo having a lower density is formed as a foundational (or seed) layer or portion 15b above a higher density Mo that forms a bulk of the rear electrode 14. For example, and without limitation, the lower density Mo foundational (or seed) portion or layer 15b may have a density that is preferably at least 10% lower than that of the underlying bulk of the Mo rear contact 14. Additionally, the lower density Mo portion 15b may have a density that is more preferably at least 20% lower than that of the underlying bulk of the Mo rear contact 14. An example deposition condition that results in lower density Mo 15b deposition S8 may include sputter depositing Mo at a higher pressure and lower power than the underlying bulk of the Mo rear contact 14. For example, and without limitation, power-to-pressure ratio of the sputtering process used to form the more dense Mo portion of the rear contact 14 may preferably be in a range of about 1/3 to about 1/20, and more preferably about 1/10, while the power-to-pressure ratio of the sputtering process used to form the less dense Mo portion 15b of the Mo rear contact may preferably be in a range of 1/21 to 1/30, and more preferably about 1/25. An example sputtering process according to certain example embodiments may be direct-current magnetron sputtering. The lower density Mo portion 15b of the rear contact is more susceptible to selenization during the high-temperature selenization process S9c used to form the CIGS absorber 16 (S9), and thus the thickness of the less dense, for example, outermost, portion of the Mo rear contact 15b may be used to control the thickness of the resulting MoSe$_2$ layer to the desired example ranges discussed above. After deposition of the low density Mo seed layer or portion 15b (S8), a CIGS absorber 16 is formed over the low density Mo seed layer or portion 15b (S9). As described above, according to certain embodiments, the CIGS absorber 16 preferably comprises a semiconductor layer 16 comprising copper indium diselenide or p-type CIGS layer (approximately CuIn$_{X-1}$Ga$_X$Se$_2$). The CIGS layer 16 may be formed S9, for example, by depositing a "seed" layer comprising Cu by, for example, co-evaporation, sputtering, electroplating or any other suitable deposition technique S9a. Other components of the CIGS absorbing layer 16, e.g., indium and/or gallium, are deposited on the Cu layer S9b and react with the Cu at high temperature, such as, for example, about 550° C., in a selenium atmosphere S9c, thereby forming the CIGS semiconductor absorber 16 in step S9. As noted above, during the high-temperature selenization process S9c used to form the CIGS, the low density Mo layer or portion 15b is susceptible to selenization and forms a MoSe$_2$ layer 15 (S10) having a thickness based on the thickness of the foundational low density Mo seed layer or portion 15b. Other layers and substrates may be provided in known manners to provide a completed photovoltaic device.

In certain example embodiments of this invention (e.g., FIGS. 2-3 and 5-9), there is provided a back contact structure for use in a photovoltaic device, comprising: a substrate; a first conductive back contact layer comprising Mo on the substrate; and a foundational seed layer comprising MoOx formed over said first conductive back contact layer, said foundational seed layer comprising MoOx being less conductive than said first conductive back contact layer comprising Mo, wherein a thickness of said foundational seed layer comprising MoOx is in a range selected from the group consisting of: from about 5-15 nm, from about 35-45 nm, from about 60-70 nm, and from about 90-100 nm, and wherein the first conductive back contact layer is located between at least the substrate and the foundational seed layer.

In the back contact of the immediately preceding paragraph, the substrate may comprise glass.

In the back contact of any of the preceding two paragraphs, a thickness of said foundational seed layer comprising MoOx may be selected from the group consisting of: about 10 nm, about 40 nm, about 65 nm, and about 95 nm.

In the back contact of any of the preceding three paragraphs, a thickness of said first conductive back contact layer comprising Mo may be in a range of from about 300-600 nm.

In the back contact of any of the preceding four paragraphs, a thickness of said first conductive back contact layer comprising Mo may be about 400 nm.

In the back contact of any of the preceding five paragraphs, a dielectric layer comprising silicon nitride and/or silicon oxynitride may be provided between at least the substrate and said first conductive back contact layer comprising Mo.

In the back contact of any of the preceding six paragraphs, said foundational seed layer may consist essentially of MoOx.

In the back contact of any of the preceding seven paragraphs, said first conductive back contact layer may consist essentially of Mo.

In the back contact of any of the preceding eight paragraphs, the foundational seed layer comprising MoOx may be adapted to be transformed into a layer comprising MoSe$_2$ having a thickness in a range selected from the group consisting of: from about 5-15 nm, from about 35-45 nm, from about 60-70 nm, and from about 90-100 nm, during a selenization process.

In certain example embodiments of this invention (e.g., see FIGS. 2-10), there is provided a back contact for use in a photovoltaic device, comprising: a substrate; a back contact layer comprising a first Mo based region comprising a first density and a second Mo based region comprising a second density, said first density being more dense than said second density, said first Mo based region being located between at least the substrate and the second. Mo based region, said second Mo based region forming a foundational seed region, wherein a thickness of said foundational seed region comprising Mo is selected from the group consisting of: from about 5-15 nm, from about 35-45 nm, from about 60-70 nm, and from about 90-100 nm.

In the back contact of the immediately preceding paragraph, the substrate may comprise glass.

In the back contact of any of the preceding two paragraphs, said second Mo based region may comprise MoOx.

In the back contact of any of the preceding three paragraphs, a thickness of said foundational seed region comprising Mo may be selected from the group consisting of: about 10 nm, about 40 nm, about 65 nm and about 95 nm.

In the back contact of any of the preceding four paragraphs, a thickness of said first Mo based region having a first density may be in a range of about 300-600 nm.

In the back contact of any of the preceding five paragraphs, said first density may be at least about 10% greater, more preferably at least about 20% greater, than said second density.

In the back contact of any of the preceding six paragraphs, a dielectric layer comprising silicon nitride and/or silicon oxynitride may be provided between at least the substrate and said first Mo based region.

In the back contact of any of the preceding seven paragraphs, the foundational seed region may be transformed into a layer comprising MoSe$_2$ having a thickness in a range selected from the group consisting of: from about 5-15 nm, from about 35-45 nm, from about 60-70 nm, and from about 90-100 nm, during a selenization process.

In the back contact of any of the preceding eight paragraphs, first Mo based region may be substantially or entirely metallic Mo.

In the back contact of any of the preceding nine paragraphs, the second Mo based region may be substantially metallic Mo and/or MoOx.

While certain example aspects of a coated article for use in photovoltaic devices and methods for making the same are described and discussed with respect to various example embodiments herein, it is to be understood that these example embodiments are meant to illustrative, not limiting. One skilled in the art would understand that various modifications may be made without departing from the true spirit and full scope of the following claims.

What is claimed is:

1. A back contact structure for use in a photovoltaic device, comprising:
    a substrate;
    a first conductive back contact layer comprising Mo on the substrate;
    a foundational seed layer comprising MoOx formed over said first conductive back contact layer, said foundational seed layer comprising MoOx being less conductive than said first conductive back contact layer comprising Mo, wherein a thickness of said foundational seed layer comprising MoOx is in a range selected from the group consisting of: from 35-45 nm, and from 60-70 nm, and wherein the first conductive back contact layer is located between at least the substrate and the foundational seed layer; and
    wherein the foundational seed layer comprising MoOx is transformable, as a result of a selenization process, into a layer comprising MoSe$_2$ having a thickness in a range selected from the group consisting of: from about 35-45 nm, and from about 60-70 nm.

2. The back contact of claim 1, wherein the substrate comprises glass.

3. The back contact of claim 1, wherein the substrate comprises metal foil.

4. The back contact of claim 1, wherein a thickness of said foundational seed layer comprising MoOx is selected from the group consisting of: about 40 nm, and about 65 nm.

5. The back contact of claim 1, wherein a thickness of said first conductive back contact layer comprising Mo is in a range of from about 300-600 nm.

6. The back contact of claim 1, wherein a thickness of said first conductive back contact layer comprising Mo is about 400 nm.

7. The back contact of claim 1, wherein a dielectric layer comprising silicon nitride and/or silicon oxynitride is provided between at least the substrate and said first conductive back contact layer comprising Mo.

8. The back contact of claim 1, wherein said foundational seed layer consists essentially of MoOx.

9. The back contact of claim 1, wherein said first conductive back contact layer consists essentially of Mo.

10. The back contact structure of claim 1, wherein the thickness of said foundational seed layer comprising MoOx is in a range of from 35-45 nm.

11. The back contact structure of claim 1, wherein the thickness of said foundational seed layer comprising MoOx is in a range of from 60-70 nm.

12. The back contact structure of claim 1, wherein the foundational seed layer comprising MoOx is sputter deposited to have an as-coated density lower than that of the first conductive back contact layer comprising Mo.

13. The back contact structure of claim 12, wherein:
    the foundational seed layer comprising MoOx is sputter deposited in an argon and oxygen inclusive atmosphere having an argon to oxygen ration of (30-100)/1; and
    the first conductive back contact layer comprising Mo is sputter deposited.

14. The back contact structure of claim 13, wherein:
    the thickness of said foundational seed layer comprising MoOx is in a range of from 35-45 nm; and
    the foundational seed layer comprising MoOx is transformable, as a result of the selenization process, into a layer comprising MoSe$_2$ having a thickness in a range of from about 35-45 nm.

15. The back contact structure of claim 13, wherein:
    the foundational seed layer comprising MoOx is sputter deposited to have an as-coated density lower than that of the first conductive back contact layer comprising Mo;
    the thickness of said foundational seed layer comprising MoOx is in a range of from 35-45 nm; and
    the foundational seed layer comprising MoOx is transformable, as a result of the selenization process, into a layer comprising MoSe$_2$ having a thickness in a range of from about 35-45 nm.

* * * * *